(12) United States Patent
Shobudani

(10) Patent No.: US 12,355,432 B2
(45) Date of Patent: Jul. 8, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Nobuyuki Shobudani, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 43 days.

(21) Appl. No.: 18/234,330

(22) Filed: Aug. 15, 2023

(65) Prior Publication Data
US 2024/0322815 A1    Sep. 26, 2024

(30) Foreign Application Priority Data
Mar. 22, 2023  (JP) ................. 2023-045746

(51) Int. Cl.
*H03K 17/16*    (2006.01)
*H03K 17/687*    (2006.01)

(52) U.S. Cl.
CPC ....... *H03K 17/166* (2013.01); *H03K 17/6872* (2013.01); *H03K 2217/0027* (2013.01)

(58) Field of Classification Search
CPC ............. H03K 17/166; H03K 17/6872; H03K 2217/0027; H03K 17/16; H03K 17/161; H03K 17/165; H03K 17/6871; H03K 17/08; H03K 17/082; H03K 17/04; H03K 17/06; H03K 17/08104; H03K 17/0812; H03K 17/081; H03K 17/08122; H03K 19/00361; H03K 19/00346

See application file for complete search history.

(56) References Cited

U.S. PATENT DOCUMENTS

| 6,121,789 A * | 9/2000 | Liu ...................... H03K 17/166 |
| | | 326/26 |
| 8,860,471 B2 | 10/2014 | Ku et al. |
| 11,469,756 B2 | 10/2022 | Thalheim |

FOREIGN PATENT DOCUMENTS

JP    2001-045742 A    2/2001

* cited by examiner

*Primary Examiner* — Jung Kim
(74) *Attorney, Agent, or Firm* — Kim & Stewart LLP

(57) ABSTRACT

A semiconductor device includes a charging circuit, a discharging circuit, a detection circuit, and a storage circuit. The charging circuit performs charging based on a first signal and a second signal. The discharging circuit performs discharging based on a third signal. The detection circuit outputs a fourth signal that has a level that varies based on a change in a rate of change of potential. The storage circuit receives a fifth signal and the fourth signal, stores a level of the fifth signal based on a first edge of the fourth signal, and outputs the second signal that is based on the stored level. The outputting is performed based on a second edge of the fourth signal.

20 Claims, 4 Drawing Sheets

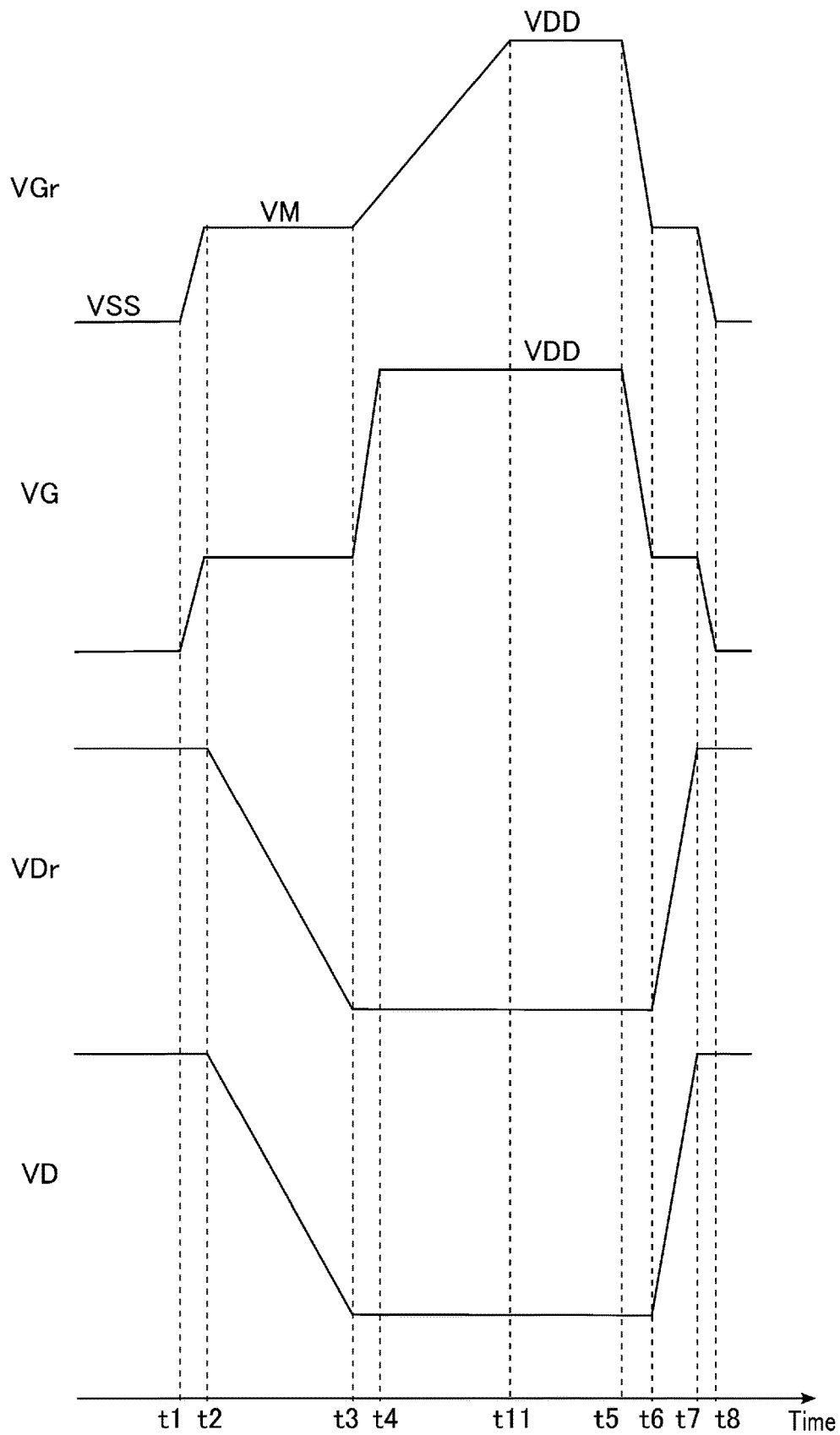
F I G. 5

SEMICONDUCTOR DEVICE

CROSS-REFERENCE TO RELATED APPLICATIONS

This application is based upon and claims the benefit of priority from Japanese Patent Application No. 2023-045746, filed Mar. 22, 2023, the entire contents of which are incorporated herein by reference.

FIELD

Embodiments described herein relate generally to semiconductor devices.

BACKGROUND

A power metal-oxide-semiconductor field-effect transistor (MOSFET) is known as a switching circuit that allows driving a load through which a large electric current flows. Such a transistor has a gate that a driving circuit can drive. The driving causes the transistor to switch between on and off states. The driving circuit is desirable to have the capability to minimize or prevent the occurrence of losses and noise in the driving circuit and the switching circuit.

BRIEF DESCRIPTION OF THE DRAWINGS

FIG. 5 illustrates change of potentials over time for several nodes in both a first referential semiconductor device and the semiconductor device according to the first embodiment.

DETAILED DESCRIPTION

In general, according to one embodiment, a semiconductor device includes a charging circuit, a discharging circuit, a detection circuit, and a storage circuit. The charging circuit performs charging based on a first signal and a second signal. The discharging circuit performs discharging based on a third signal. The detection circuit outputs a fourth signal that has a level that varies based on a change in a rate of change of potential. The storage circuit receives a fifth signal and the fourth signal, stores a level of the fifth signal based on a first edge of the fourth signal, and outputs the second signal that is based on the stored level. The outputting is performed based on a second edge of the fourth signal.

Embodiments will now be described with reference to the figures.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment

1.1. Configuration (Structure)

Figure 1:
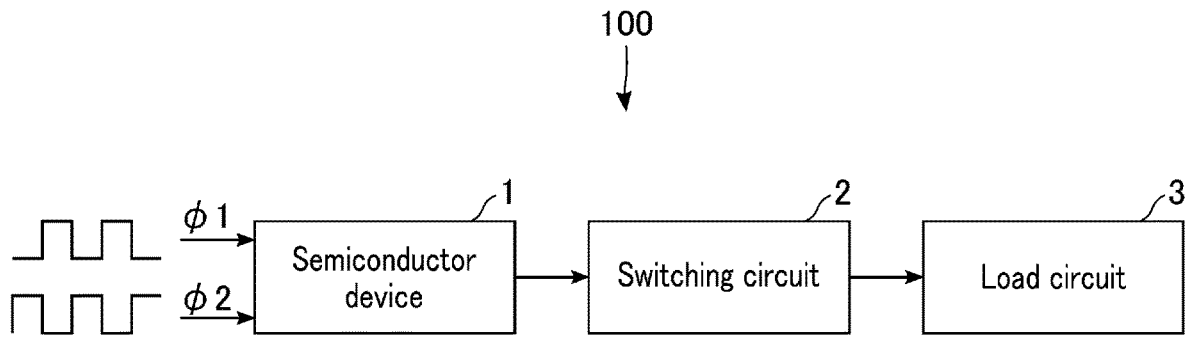
FIG. 1 illustrates functional blocks of a system that includes a semiconductor device according to the first embodiment.

FIG. 1 illustrates functional blocks of a system that includes a semiconductor device 1 according to a first embodiment. As illustrated in FIG. 1, the system 100 includes the semiconductor device 1, a switching circuit 2, and a load circuit 3.

The semiconductor device 1 is a device that includes a semiconductor. The semiconductor device 1 includes elements formed on a semiconductor and functions as a driving circuit. The semiconductor device 1 can be implemented, for example, as a semiconductor chip or in the form of a package that includes a semiconductor chip and external connection terminals. The semiconductor device 1 receives digital driving signals $\varphi 1$ and $\varphi 2$. The semiconductor device 1 is coupled to the switching circuit 2. The semiconductor device 1 controls the switching circuit 2 based on the driving signals $\varphi 1$ and $\varphi 2$. In one example, the driving signals $\varphi 1$ and $\varphi 2$ are complementary, exhibiting opposite logic levels.

The switching circuit 2 electrically couples and decouples two nodes in the switching circuit 2. The switching circuit 2 operates under the control of the semiconductor device 1.

The load circuit 3 is a load component in the system 100. Examples of the load circuit 3 include a motor. The load circuit 3 receives a power supply voltage. The load circuit 3 is coupled via the switching circuit 2 between a node receiving a power supply voltage and a node receiving a ground voltage. The flow of electrical current through the load circuit 3 is based on the electrical coupling and decoupling by the switching circuit 2.

Figure 2:
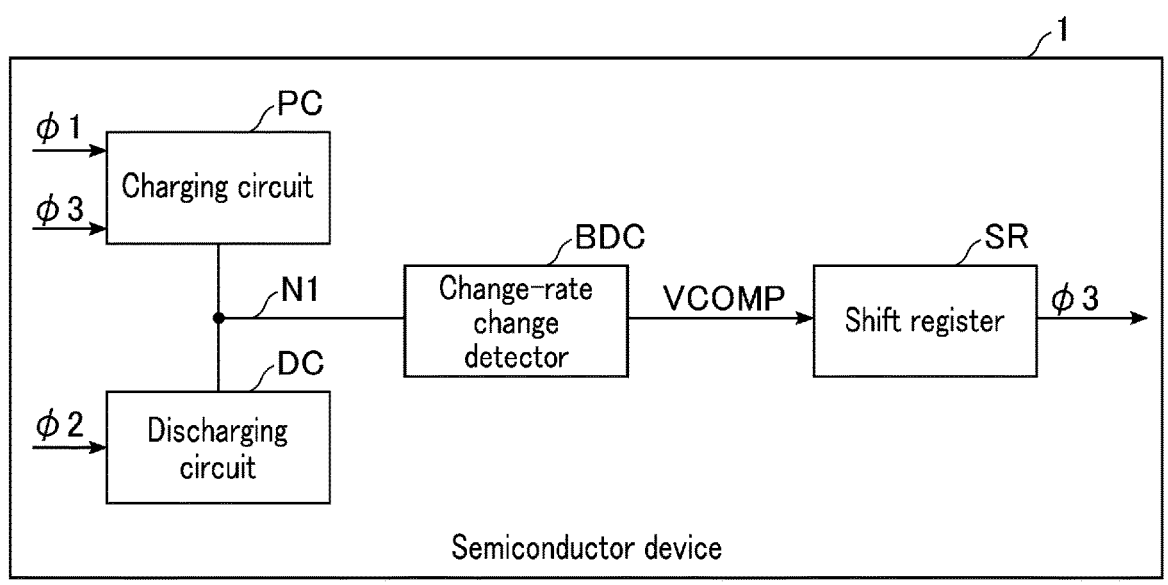
FIG. 2 illustrates functional blocks of the semiconductor device according to the first embodiment.

FIG. 2 illustrates the functional blocks of the semiconductor device 1 according to the first embodiment. As illustrated in FIG. 2, the semiconductor device 1 includes a charging circuit PC, a discharging circuit DC, a change-rate change detector BDC, and a shift register SR.

The charging circuit PC is a circuit that charges a node N1 in the semiconductor device 1. The node N1 is coupled to the switching circuit 2. The potential at the node N1 controls the electrical coupling and decoupling of the switching circuit 2. The charging circuit PC is capable of dynamically switching the state of the node N1 between two modes, i.e., charging the node N1 with only current and charging the node N1 with both current and voltage. The charging circuit PC charges the node N1 based on driving signals $\varphi 1$ and $\varphi 3$. The driving signal $\varphi 3$ is an internal signal of the semiconductor device 1.

The discharging circuit DC is a circuit that discharges the node N1. In one example, the discharging circuit DC discharges the node N1 with current. The discharging circuit DC discharges the node N1 based on the driving signal $\varphi 2$.

The change-rate change detector BDC detects the slope of the change in the potential of the node N1, i.e., a change in the rate of change. The change-rate change detector BDC outputs a signal VCOMP of a certain level in the case where the difference between the magnitudes of the rate of change before and after the change in the rate of change of the potential at the node N1 exceeds a certain magnitude.

The shift register SR is a storage circuit that receives an input signal and a clock signal, and it stores and outputs the input signal based on the clock signal. The shift register SR receives the driving signal $\varphi 1$ as the input signal. The shift register SR receives the signal VCOMP as the clock signal. The shift register SR stores the level of the driving signal $\varphi 1$ at the transition of the signal VCOMP to a certain level, i.e., at a triggering of the edge. In one example, the edge can be defined as the transition of the signal VCOMP to a high level. The shift register SR continues to output the level of the input signal stored at a certain first edge, starting from the timing of the second edge following the first edge. The shift register SR outputs the driving signal φ3.

Figure 3:
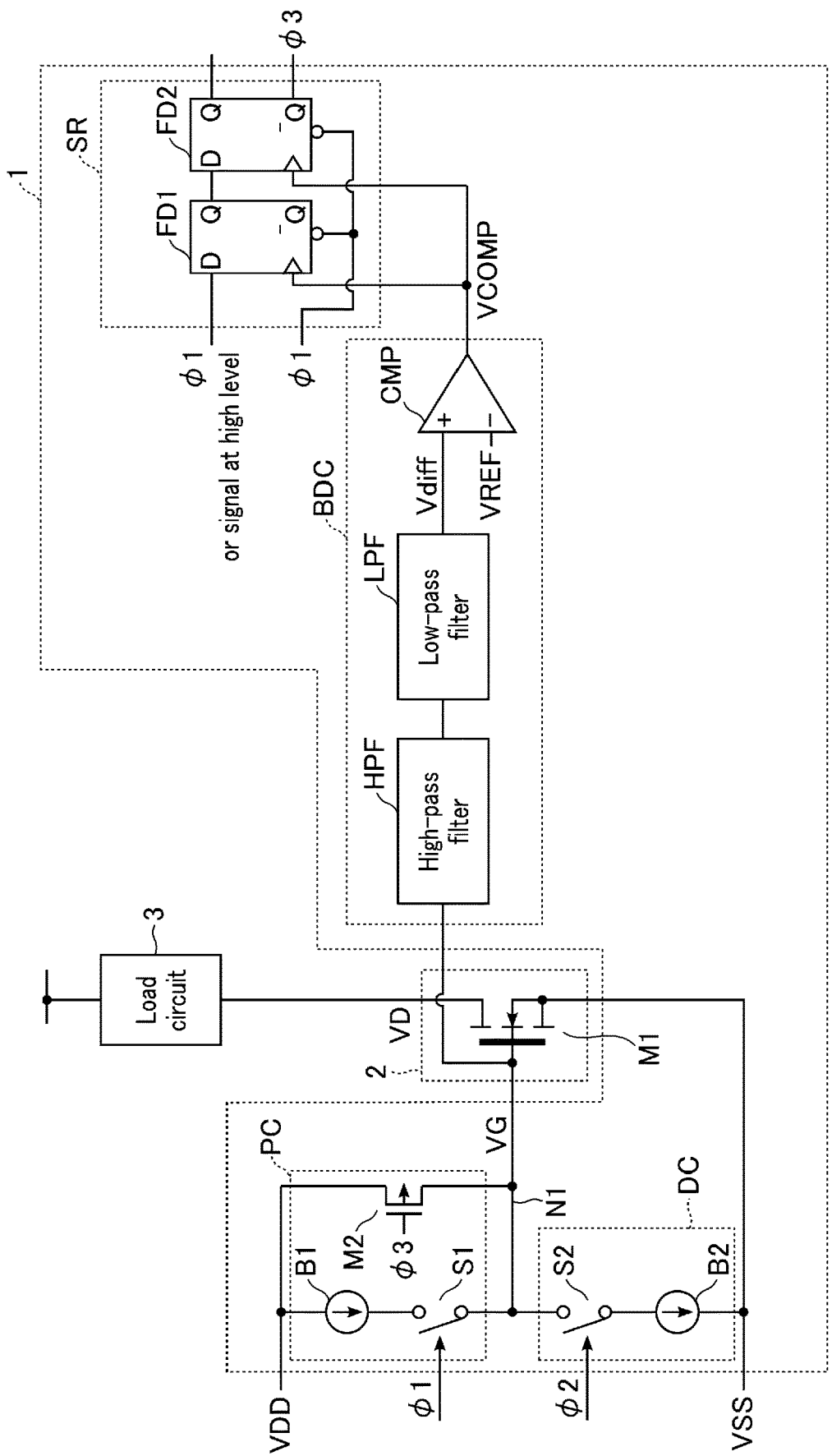
FIG. 3 is a circuit diagram of the system that includes the semiconductor device according to the first embodiment.

FIG. 3 is a circuit diagram of the system that includes the semiconductor device according to the first embodiment. As illustrated in FIG. 3, in one example, the switching circuit 2 includes an N-channel metal-oxide-semiconductor field-effect transistor (MOSFET) M1. The following description is based on the example illustrated in FIG. 3. The transistor M1 is coupled between the load circuit 3 and a node that receives a ground voltage VSS. In one example, the ground voltage VSS is 0V. The transistor M1 is coupled to a node N1 at its gate, and has a gate potential VG at its gate. The transistor M1 has a drain potential VD at its drain.

In the following description, one of the source and drain of the transistor may be referred to as one end of the transistor, and the other of the source and drain of the transistor may be referred to as the other end of the transistor.

In one example, the charging circuit PC includes a current circuit B1, a switching circuit S1, and a P-channel MOSFET M2. The current circuit B1 has one end coupled to a node that receives a power supply voltage VDD and has the other end that outputs a current. The current being output is substantially constant. The power supply voltage VDD is higher than a ground voltage VSS. The term "substantially", as used herein and in the claims, indicates that the term described by the term "substantially" includes tolerance to account for unavoidable factors, without necessitating exact adherence to the literal interpretation of the text to the extent of the content expressed by the text. For example, "substantially constant" implies an intended constancy while acknowledging that it may not be perfectly constant due to limitations in manufacturing and/or measurement techniques. The current circuit B1 can be implemented as a constant current circuit or a high-resistance element.

The switching circuit S1 has one end that receives the current output from the current circuit B1. The switching circuit S1 has the other end that is coupled to the node N1. The switching circuit S1 receives the driving signal φ1 and is turned on or off based on the driving signal φ1. The switching circuit S1 establishes an electrical coupling between the one and the other ends while in an on state. The switching circuit S1 establishes an electrical decoupling between the one and the other ends while in and off state. In one example, the switching circuit S1 is in the on state while the driving signal φ1 is at a high level and in the off state while the driving signal φ1 is at a low level. The current flows from the current circuit B1 to the node N1 while the switching circuit S1 is in the on state. In one example, the switching circuit S1 is implemented as a transistor, such as a MOSFET.

The transistor M2 is coupled between the node of the power supply voltage VDD and the node N1. The transistor M2 has a gate that receives the driving signal φ3. The transistor M2 has an on-resistance that is lower than the resistance of the current circuit B1.

In one example, the discharging circuit DC includes a current circuit B2 and a switching circuit S2. The switching circuit S2 has one end that is coupled to the node N1. The switching circuit S2 receives the driving signal φ2 and is turned on or off based on the driving signal φ2. The switching circuit S2 establishes an electrical coupling between both ends of the switching circuit S2 while in the on state. The switching circuit S2 establishes an electrical decoupling between both ends of the switching circuit S2 while in the off state. In one example, the switching circuit S2 is in the on state while the driving signal φ2 is at a high level and in the off state while the driving signal φ2 is at a low level. In one example, the switching circuit S2 is implemented as a transistor, such as a MOSFET.

The current circuit B2 has one end that draws a current and the other end coupled to a node that receives the ground voltage VSS. The current being drawn is substantially constant. The one end of the current circuit B2 is coupled to the other end of the switching circuit S2. The current circuit B2 can be implemented as a constant current circuit or a high-resistance element.

In one example, the change-rate change detector BDC includes a high-pass filter HPF, a low-pass filter LPF, and a comparator CMP.

The high-pass filter HPF is a circuit that receives a signal and outputs a high-frequency component signal included within a predetermined magnitude range of the received signal. The high-pass filter HPF is coupled at its input to the node N1. The high-pass filter HPF outputs a signal that is dependent on a change in the gate potential VG.

The low-pass filter LPF is a circuit that receives a signal and outputs a low-frequency component signal included within a predetermined magnitude range of the received signal. The range of frequencies passed through the low-pass filter LPF is lower than the range of frequencies passed through the high-pass filter HPF. The low-pass filter LPF receives, at its input, a signal output from the high-pass filter HPF. The low-pass filter LPF removes noise from the signal, which is output from the high-pass filter HPF and is dependent on the change in the gate potential VG. The signal output from the low-pass filter LPF functions as a detection signal Vdiff. The detection signal Vdiff indicates that there has been a certain change in the rate of change of the gate potential VG. In the case where the gate potential VG does not change at a certain rate, the detection signal Vdiff becomes the value of a bias voltage VBIAS, which is set within the range of voltage input to the non-inverting input of the comparator CMP coupled at the subsequent stage.

The comparator CMP amplifies the difference between the magnitude of the voltage on a non-inverting input and the magnitude of the voltage on an inverting input and outputs the resultant voltage. The comparator CMP receives the detection signal Vdiff at its non-inverting input. The comparator CMP receives a voltage at its inverting input, where a referential potential VREF of substantially constant magnitude is applied. The magnitude of the referential potential VREF is lower than that of the bias voltage VBIAS. The output of the comparator CMP functions as a signal VCOMP.

In one example, the shift register SR includes two D flip-flops FD1 and FD2. The two flip-flops FD1 and FD2 are coupled in series. Specifically, the flip-flop FD1 receives the driving signal φ1 or a signal fixed at a high level at its D input and is coupled to a D input of the flip-flop FD2 at its Q output. The ⁻Q output of the flip-flop FD2 functions as the driving signal φ3. The flip-flops FD1 and FD2 receive the signal VCOMP at their respective clock inputs. The flip-flops FD1 and FD2 receive, at their respective reset inputs (or clear inputs), a signal having a level inverted from that of the driving signal φ1 (i.e., an inverted signal).

The shift register SR can further include a flip-flop FD3 positioned between the flip-flops FD1 and FD2. The flip-flop FD3 receives the Q output of the flip-flop FD1 at its D input and is coupled at its Q output to the D input of the flip-flop FD2. The flip-flop FD3 receives an inverted signal of the signal VCOMP at its clock input and receives an inverted signal of the driving signal φ1 at its reset input. Providing the flip-flop FD3 of such coupling enables the synchronization of the operation timings of the flip-flops FD1 and FD2, even in the case where the distance between the flip-flops FD1 and FD2 is large.

1.2. Operation

Figure 4:
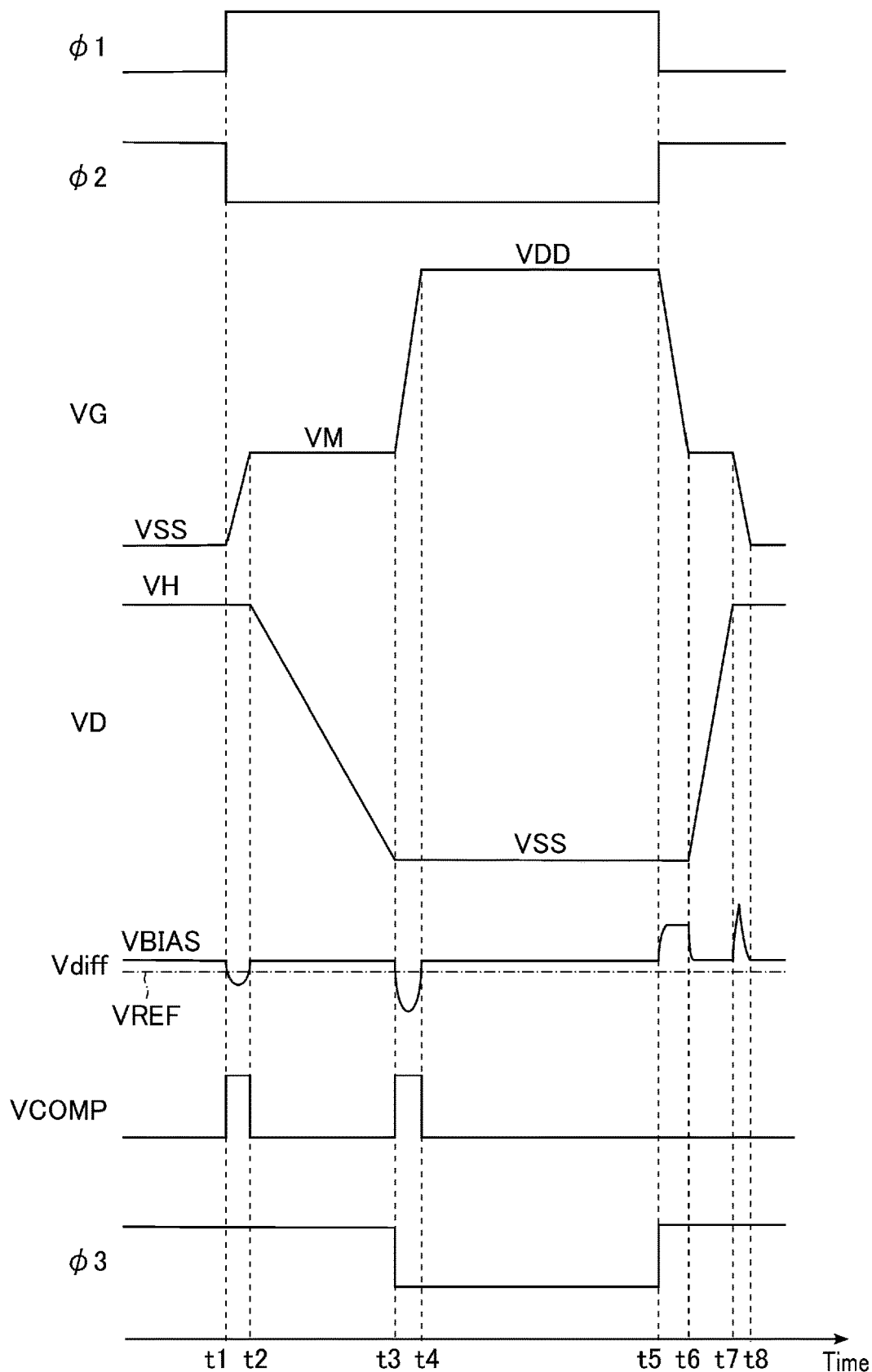
FIG. 4 illustrates change of potentials and signals over time for several nodes in the semiconductor device according to the first embodiment.

FIG. 4 illustrates the potentials and signals over time for several nodes in the semiconductor device according to the first embodiment.

At the start of the period illustrated in FIG. 4, the respective magnitudes of the potential and signal magnitudes are as follows. The driving signal φ1 is at a low level, while the driving signal φ2 is at a high level. This causes the switching circuit S1 to be in the off state and the switching circuit S2 to be in the on state. Thus, the gate of the transistor M1 is discharged, causing the gate potential VG to reach the ground potential VSS of a magnitude equivalent to the ground voltage VSS. This causes the transistor M1 to be in the off state. In one example, the low level corresponds to the ground potential VSS. The low level is lower than the high level. The driving signal φ1 is at a low level, so the operation for the shift register SR to store a high level based on the edge of the signal VCOMP is disabled.

The transistor M1 is in the off state, so the drain potential VD has a high potential VH of a certain magnitude. The potential VH is higher than the ground voltage VSS.

The gate potential VG has a constant magnitude, so the detection signal Vdiff has a bias potential VBIAS of the magnitude of the bias voltage VBIAS. Thus, the signal VCOMP is at a low level.

The driving signal φ3 is at a high level.

At time t1, the driving signal φ1 is set to a high level, whereas the driving signal φ2 is set to a low level. This causes the switching circuit S1 to turn on and the switching circuit S2 to turn off. Thus, the discharging at the gate of the transistor M1 through the switching circuit S2 stops, and the charging at the gate of the transistor M1 through the switching circuit S1 starts. In addition, as the driving signal φ1 is at a high level, the operation for the shift register SR to store the high level based on the edge of the signal VCOMP is enabled.

The charging at the gate of the transistor M1 causes the gate potential VG to rise, starting from time t1. The rate of the charging depends on either the magnitude of the current in the current circuit B1 or the magnitude of the resistance in the case where the current circuit B1 is configured as a resistor. Thus, the gate potential VG rises at a substantially constant slope (or rate), starting from time t1. The slope can be set to any magnitude through the design of the characteristics of the current circuit B1.

Once the gate potential VG starts to rise, the flow of a drain current through the transistor M1 is established. Thus, the drain potential VD drops at a certain magnitude slew rate, starting from time t2.

At time t1, the start of the rise in the gate potential VG leads to the drop of the detection signal Vdiff from the bias potential VBIAS in a short period of time. This drop causes the detection signal Vdiff to fall below the referential potential VREF. The referential potential VREF is determined based on the magnitude of a change intended to be detected in the rate of change of the gate potential VG, i.e., the magnitude of a change (or drop) in the detection signal Vdiff. The falling of the detection signal Vdiff below the referential potential VREF causes the signal VCOMP to enter a high level during the period from time t1 to time t2. The signal VCOMP at the high level causes the shift register SR to store the high level. The level of the driving signal φ1 at time t1 is stored in the flip-flop FD1 in the example where the shift register SR includes the flip-flops FD1 and FD2.

The rising of the signal VCOMP occurs at the first instance, starting from time t1. Thus, the level stored in the shift register SR at time t1 is not yet output. Accordingly, the driving signal φ3 remains at a high level at time t1.

The charging at the gate of the transistor M1 starting from time t1 continues, and at time t2, the gate potential VG reaches an intermediate potential VM of a certain magnitude. The intermediate potential VM is at a level approximately equal to a threshold voltage of the transistor M1. The drain potential VD continuously drops starting from time t2. While the drain potential VD is dropping, the Miller effect in the transistor M1 causes the equivalent (or apparent) capacitance at the gate of the transistor M1 to continue increasing. Thus, despite the charging at the gate of the transistor M1 starting from time t1, the gate potential VG does not rise and remains at the intermediate potential VM, starting from time t2.

The slope of the rise of the gate potential VG starting from time t1 is substantially constant. Thus, the detection signal Vdiff drops at time t1 in a short period of time, followed by a return to the bias potential VBIAS. The detection signal Vdiff exceeds the referential potential VREF during the process leading up to the return to the bias potential VBIAS. Thus, the signal VCOMP becomes low level at time t2.

The drain potential VD continues to drop starting from time t2 and reaches the ground potential VSS at time t3. Then, the drain potential VD stops dropping, and the increase in the equivalent capacitance at the gate of the transistor M1, which has continued starting from time t2, stops at time t3.

This stop of the increase in the equivalent capacitance at the gate of the transistor M1 at time t3 leads to the charging by the current circuit B1, causing the gate potential VG to rise starting from time t3.

The gate potential VG starts to rise at time t3, which leads to the drop of the detection signal Vdiff from the bias potential VBIAS in a short period of time. This drop causes the detection signal Vdiff to fall below the referential potential VREF. The falling of the detection signal Vdiff below the referential potential VREF causes the signal VCOMP to be at a high level at time t3. The signal VCOMP at the high level causes the shift register SR to store the high level. In addition, based on the rising of the signal VCOMP at time t3, the shift register SR continues to output, starting from t3, the inverted level of the level stored at time t1, i.e., stored upon the rising of the signal VCOMP immediately before the rising of the signal VCOMP at time t3, as the driving signal φ3. In other words, the driving signal φ3 becomes low level at time t3.

The driving signal φ3, being at the low level, causes the transistor M2 to turn on at time t3. This causes the gate of the transistor M1 to be charged by the power supply voltage VDD through the transistor M2 that is in the on state. The charging by both the current circuit B1 and the power supply voltage VDD starting from time t3 leads to the rise in the gate potential VG in a short period of time.

The charging at the gate of the transistor M1 continues starting from time t3, and the gate potential VG reaches the power supply potential VDD at time t4. The gate potential remains at the power supply potential VDD from time t4 onwards.

The slope of the rise of the gate potential VG starting from time t3 is substantially constant. Thus, the detection signal Vdiff drops at time t3 in a short period of time, followed by a return to the bias potential VBIAS. The detection signal Vdiff exceeds the referential potential VREF during the process leading up to the return to the bias potential VBIAS. Thus, the signal VCOMP becomes low level at time t4.

At time t5, the driving signal φ1 becomes low level, and the driving signal φ2 becomes high level. This transition causes the switching circuit S1 to turn off and the switching circuit S2 to turn on. Thus, the charging at the gate of the transistor M1 through the switching circuit S1 stops, and the discharging at the gate of the transistor M1 through the switching circuit S2 starts.

The driving signal φ1, being a low level at time t5, causes the storage operation based on the edge of the signal VCOMP to be disabled and the output of the shift register SR to be reset, i.e., the driving signal φ3 becomes high level at time t5. Thus, the transistor M2 is turns off, stopping the charging at the gate of the transistor M1 through the transistor M2.

The stopping of the charging and the start of the discharging of the transistor M1 leads to the drop of the gate potential VG, starting from time t5. The rate of discharging depends on either the magnitude of the current from the current circuit B2 or the magnitude of the resistance in the case where the current circuit B2 is configured as a resistor. Thus, the gate potential VG drops at a substantially constant slope starting from time t2. The slope can be set to any magnitude through the design of the characteristics of the current circuit B2.

At time t5, the start of the drop in the gate potential VG leads to the rise of the detection signal Vdiff from the bias potential VBIAS in a short period of time. However, this rise does not affect the operation of the semiconductor device 1.

The discharging at the gate of the transistor M1 continues starting from time t5, and the gate potential VG reaches the threshold voltage of the transistor M1 at time t6. This turns off the transistor M1, resulting in the rise of the drain potential VD.

The gate potential VG remains constant in magnitude until reaching time t7 due to the Miller effect in the transistor M1. The gate potential VG drops from time t7. In addition, at time t7, the drain potential VD reaches the potential VH.

At time t7, the magnitude of the gate potential VG starts to drop, leading to the rise of the detection signal Vdiff from the bias potential VBIAS in a short period of time. However, this rise does not affect the operation of the semiconductor device 1.

At time t8, the gate potential VG reaches the ground potential VSS.

1.3. Advantages (Advantageous Effects)

According to the first embodiment, it is possible to provide the semiconductor device that operates at high speed while minimizing or preventing the occurrence of losses and noise, as described below.

For comparison purposes, a description will be provided for a first referential semiconductor device and a second referential semiconductor device. The first referential semiconductor device includes only the current circuits B1 and B2 and the switching circuits S1 and S2 of the semiconductor device 1 according to the first embodiment. Thus, the gate of the transistor M1 is charged only by the current circuit B1, resulting in a relatively slow rise of the gate potential VG. In particular, the rise of the gate potential VG after the end of the period where the gate potential VG has a constant magnitude is relatively slow. The gate potential VG affects the on-resistance of the transistor M1, and a higher gate potential VG leads to a higher on-resistance. A large on-resistance of the transistor M1 increases the power consumption based on the drain current and on-resistance of the transistor M1. Thus, a relatively slow rise of the gate potential VG causes significant losses. Increasing the current output from the current circuit B1 is considered to minimize or prevent power consumption. However, if the output current is large, the gate potential VG undergoes rapid changes, potentially leading to noise caused by electromagnetic interference (EMI). Thus, low losses and low noise are conflicting requirements.

To achieve a balance between low losses and low noise, the second referential semiconductor device includes the transistor M2, similar to the semiconductor device 1 according to the first embodiment. On the other hand, the second referential semiconductor device generates the driving signal φ3 by comparing the gate potential VG with the referential potential. Specifically, in the case where the gate potential VG exceeds the referential potential, the driving signal φ3 switches to a high level, and the gate potential VG is charged using both current and voltage. Decrease in the output current of the current circuit allows the gate of the transistor M1 to be initially slowly charged by a small current. Then, the occurrence of noise caused by rapid change in the drain potential VD, especially during the period where the gate potential VG has a constant magnitude, is minimized or prevented. Subsequently, the fast charging during the re-rise of the gate potential VG using both current and voltage also enables losses in the transistor M1 to be minimized or prevented. The fast rise of the gate potential VG also enables high-speed operation using the second referential semiconductor device.

The second referential semiconductor device uses the gate potential VG as it is to generate the driving signal φ3. The gate potential VG depends on the threshold voltage of the transistor M1. Although the threshold voltage of the transistor M1 is intended to have a designed magnitude, the threshold voltage of the transistor M1 can vary among multiple transistors M1 due to limitations in the manufacturing technology of the transistor M1. Thus, the difference in the magnitude of the threshold voltage of the transistor M1 driven by the second referential semiconductor device from the intended magnitude causes the rising timing of the driving signal φ3 to be non-constant and, accordingly, the start timing of the charging at the gate of the transistor M1 by the voltage is non-constant. Thus, the losses in the transistor M1 are non-constant due to the dependency on the threshold voltage of the transistor M1.

In the semiconductor device 1 according to the first embodiment, the gate of the transistor M1 is coupled to the current circuit B1 and also coupled to the node of the power supply potential VDD through the transistor M2. The transistor M2 turns on after a delay from the rising of the driving signal φ1. Thus, similar to the first referential semiconductor device, the gate of the transistor M1 is charged using current immediately after the rising of the driving signal φ1, and then charged using both current and voltage with a delay from the rising. Thus, the semiconductor device 1 is capable of driving the transistor M1 with low losses and low noise using the same mechanism as that described above for the first referential semiconductor device. Furthermore, it is possible for the semiconductor device 1 to operate at high-speed using the same mechanism as that described for the second referential semiconductor device.

FIG. 5 illustrates the potentials over time for several nodes in the first referential semiconductor device and the semiconductor device 1. Specifically, FIG. 5 illustrates a gate potential VGr and a drain potential VDr of the first referential semiconductor device, as well as the gate potential VG and drain potential VD of the semiconductor device 1. As illustrated in FIG. 5, both the first referential semiconductor device and the semiconductor device 1 have the same rate of drop in the drain potential, i.e., the same slew rate. On the other hand, the gate potential VGr of the first referential semiconductor device rises slowly starting from time t3 and reaches the power supply potential VDD at time t11. Time t11 is significantly delayed compared to time t4 when the gate potential VG reaches the power supply potential VDD. As apparent, the semiconductor device 1 can quickly raise the gate potential VG while maintaining the same slew rate as the first referential semiconductor device, allowing for operation with lower losses than the first referential semiconductor device.

Furthermore, the semiconductor device 1 generates the driving signal φ3 based on the change in the rate of change of the gate potential VG. Thus, the driving signal φ3 is independent of the gate potential VG as it is. Thus, the driving signal φ3 does not depend on the gate potential VG and, accordingly, it does not depend on the threshold voltage of the transistor M1 that affects the gate potential VG. Thus, regardless of variations in the threshold voltage of the transistor M1, the driving signal φ3 rises at the end of the period over which the gate potential VG has a constant magnitude. In other words, the semiconductor device 1 can start the charging at the gate of the transistor M1 using the voltage at a timing that is independent of the variations in the threshold voltage of the transistor M1.

1.4. Modification

The description above is provided for the technology of charging the node N1 using only current or both current and voltage during the rising of the gate potential VG, as well as switching between charging using only current and charging using both current and voltage. The first embodiment can be further applied to the technology of discharging the node N1 using only current or both current and voltage during the falling of the gate potential and switching between discharging using only current and discharging using both current and voltage. Specifically, an N-channel MOSFET M3 can be provided between the node N1 and the node of the ground potential VSS, and the transistor M3 receives a driving signal φ4 at its gate. The driving signal φ4 is based on the change in the rate of change of gate potential VG during the falling of the gate potential VG, similar to the driving signal φ2. In one example, a circuit is provided for detecting the change in the rate of change of the gate potential VG during the falling of the gate potential VG and generating the driving signal φ4. This circuit has a similar configuration to the circuit for detecting the change in the rate of change of the gate potential VG during the rising of the gate potential VG and generating the driving signal φ3. In this example, the detection signal Vdiff rises in the case where the rate of change of the gate potential VG changes during the rising of the gate potential VG, as illustrated at times t5 and t7 in FIG. 4. Based on this rising, the level of driving signal φ2 is stored, and the driving signal φ4 based on the driving signal φ2 is generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a charging circuit that performs charging based on a first signal and a second signal;
   a discharging circuit that performs discharging based on a third signal;
   a detection circuit that outputs a fourth signal that has a level that varies based on a change in a rate of change of potential; and
   a storage circuit that receives a fifth signal and the fourth signal, stores a level of the fifth signal based on a first edge of the fourth signal, and outputs the second signal that is based on the stored level, the outputting being performed based on a second edge of the fourth signal.

2. The semiconductor device according to claim 1, wherein
   the storage circuit includes a shift register that continues to output the second signal that has a level opposite to the stored level from the second edge of the fourth signal.

3. The semiconductor device according to claim 2, wherein
   the shift register includes:
   a first flip-flop circuit that receives the fifth signal and the fourth signal and outputs a sixth signal that has a level that the fifth signal has at an edge of the fourth signal, and
   a second flip-flop circuit that receives the sixth signal and the fourth signal and outputs a signal that has a level opposite to a level that the sixth signal has at the edge of the fourth signal as the second signal.

4. The semiconductor device according to claim 3, further comprising a first node, wherein
   the charging circuit charges the first node,
   the discharging circuit discharges the first node, and
   the potential is a potential of the first node.

5. The semiconductor device according to claim 4, wherein
   the detection circuit includes:
   a high-pass filter with an input coupled to the first node, and
   a comparator that has non-inverting and inverting inputs and outputs the fourth signal, the non-inverting input receiving an output of the high-pass filter, and the inverting input receiving a first voltage.

6. The semiconductor device according to claim 5, wherein
   the charging circuit includes:
   a first circuit and a first switching circuit coupled in series between a second node and the first node, and
   a first transistor coupled between the second node and the first node,
   the first switching circuit receives the first signal, and
   the first transistor has a gate that receives the second signal.

7. The semiconductor device according to claim 6, wherein
   the discharging circuit includes a second circuit and a second switching circuit coupled in series between the first node and a third node, and
   the second switching circuit receives the third signal.

8. The semiconductor device according to claim 7, wherein
   the third signal has a level opposite to a level of the first signal.

9. The semiconductor device according to claim 7, wherein
the first circuit includes a constant current circuit, and
the second circuit includes a constant current circuit.

10. The semiconductor device according to claim 7, wherein
the first circuit includes a resistance element, and
the second circuit includes a resistance element.

11. The semiconductor device according to claim 4, wherein
the charging circuit includes:
  a first circuit and a first switching circuit coupled in series between a second node and the first node, and
  a first transistor coupled between the second node and the first node,
the first switching circuit receives the first signal, and
the first transistor has a gate that receives the second signal.

12. The semiconductor device according to claim 11, wherein
the discharging circuit includes a second circuit and a second switching circuit coupled in series between the first node and a third node, and
the second switching circuit receives the third signal.

13. The semiconductor device according to claim 12, wherein
the third signal has a level opposite to a level of the first signal.

14. The semiconductor device according to claim 1, further comprising a first node, wherein
the charging circuit charges the first node,
the discharging circuit discharges the first node, and
the potential is a potential of the first node.

15. The semiconductor device according to claim 14, wherein
the detection circuit includes:
a high-pass filter with an input coupled to the first node, and
a comparator that has non-inverting and inverting inputs and outputs the fourth signal, the non-inverting input receiving an output of the high-pass filter, and the inverting input receiving a first voltage.

16. The semiconductor device according to claim 15, wherein
the charging circuit includes:
  a first circuit and a first switching circuit coupled in series between a second node and the first node, and
  a first transistor coupled between the second node and the first node,
the first switching circuit receives the first signal, and
the first transistor has a gate that receives the second signal.

17. The semiconductor device according to claim 16, wherein
the discharging circuit includes a second circuit and a second switching circuit coupled in series between the first node and a third node, and
the second switching circuit receives the third signal.

18. The semiconductor device according to claim 17, wherein
the third signal has a level opposite to a level of the first signal.

19. The semiconductor device according to claim 17, wherein
the first circuit includes a constant current circuit, and
the second circuit includes a constant current circuit.

20. The semiconductor device according to claim 17, wherein
the first circuit includes a resistance element, and
the second circuit includes a resistance element.

* * * * *